(12) United States Patent
Campi, Jr. et al.

(10) Patent No.: US 9,978,874 B2
(45) Date of Patent: *May 22, 2018

(54) GATE-ALL-AROUND FIN DEVICE

(71) Applicant: INTERNATIONAL BUSINESS MACHINES CORPORATION, Armonk, NY (US)

(72) Inventors: John B. Campi, Jr., Westford, VT (US); Robert J. Gauthier, Jr., Hinesburg, VT (US); Rahul Mishra, Essex Junction, VT (US); Souvick Mitra, Essex Junction, VT (US); Mujahid Muhammad, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/402,504

(22) Filed: Jan. 10, 2017

(65) Prior Publication Data
US 2017/0125598 A1 May 4, 2017

Related U.S. Application Data

(63) Continuation of application No. 14/995,307, filed on Jan. 14, 2016, now Pat. No. 9,590,108, which is a (Continued)

(51) Int. Cl.
*H01L 29/66* (2006.01)
*H01L 29/78* (2006.01)
(Continued)

(52) U.S. Cl.
CPC ...... *H01L 29/7856* (2013.01); *H01L 29/0653* (2013.01); *H01L 29/0696* (2013.01);
(Continued)

(58) Field of Classification Search
None
See application file for complete search history.

(56) References Cited

U.S. PATENT DOCUMENTS 5,580,802 A 12/1996 Mayer et al.
6,137,140 A 10/2000 Efland et al.
(Continued)

OTHER PUBLICATIONS

Doyle et al., "High Performance Fully-Depleted Tri-Gate CMOS Transistors," IEEE Electron Device Letters, vol. 24, No. 4, Apr. 2003, pp. 263-265.
(Continued)

*Primary Examiner* — Alexander Ghyka
(74) *Attorney, Agent, or Firm* — Steven Meyers; Andrew M. Calderon; Roberts Mlotkowski Safran Cole & Calderon, P.C.

(57) ABSTRACT

A gate-all around fin double diffused metal oxide semiconductor (DMOS) devices and methods of manufacture are disclosed. The method includes forming a plurality of fin structures from a substrate. The method further includes forming a well of a first conductivity type and a second conductivity type within the substrate and corresponding fin structures of the plurality of fin structures. The method further includes forming a source contact on an exposed portion of a first fin structure. The method further comprises forming drain contacts on exposed portions of adjacent fin structures to the first fin structure. The method further includes forming a gate structure in a dielectric fill material about the first fin structure and extending over the well of the first conductivity type.

20 Claims, 6 Drawing Sheets

Related U.S. Application Data continuation of application No. 14/547,780, filed on Nov. 19, 2014, now Pat. No. 9,281,379.

(51) Int. Cl.
*H01L 29/06* (2006.01)
*H01L 29/10* (2006.01)

(52) U.S. Cl.
CPC .... *H01L 29/1095* (2013.01); *H01L 29/66681* (2013.01); *H01L 29/66795* (2013.01); *H01L 29/7816* (2013.01); *H01L 2029/7858* (2013.01)

(56) References Cited

U.S. PATENT DOCUMENTS

| | | | |
|---|---|---|---|
| 6,495,403 | B1 | 12/2002 | Skotnicki et al. |
| 7,456,476 | B2 | 11/2008 | Hareland et al. |
| 7,517,761 | B2 | 4/2009 | Kao et al. |
| 7,625,793 | B2 | 12/2009 | Calafut |
| 7,750,401 | B2 | 7/2010 | Cai |
| 7,923,315 | B2 | 4/2011 | Pouydebasque et al. |
| 7,977,715 | B2 | 7/2011 | Cai |
| 8,076,749 | B2 | 12/2011 | Kitagawa |
| 8,129,800 | B2 | 3/2012 | Yun et al. |
| 8,159,001 | B2 | 4/2012 | Wang |
| 8,350,298 | B2 | 1/2013 | Xiao et al. |
| 8,664,720 | B2 | 3/2014 | Shrivastava et al. |
| 8,686,510 | B2 | 4/2014 | Gossner et al. |
| 8,741,776 | B2 | 6/2014 | De et al. |
| 9,281,379 | B1 | 3/2016 | Campi, Jr. |
| 9,590,108 | B2 * | 3/2017 | Campi, Jr. ........ H01L 29/66712 |
| 9,818,542 | B2 | 11/2017 | Campi, Jr. et al. |
| 2005/0003592 | A1 | 1/2005 | Jones |
| 2008/0237705 | A1 | 10/2008 | Theeuwen et al. |
| 2011/0254058 | A1 | 10/2011 | Xiao et al. |
| 2012/0037984 | A1 | 2/2012 | Yu |
| 2012/0193707 | A1 | 8/2012 | Huang et al. |
| 2012/0273882 | A1 | 11/2012 | Ratnam |
| 2013/0174103 | A1 | 7/2013 | Shieh et al. |
| 2016/0141365 | A1 | 5/2016 | Campi, Jr. et al. |
| 2016/0141421 | A1 | 5/2016 | Campi, Jr. et al. |
| 2016/0181162 | A1 | 6/2016 | Campi, Jr. et al. |
| 2016/0284852 | A1 | 9/2016 | Campi, Jr. et al. |

OTHER PUBLICATIONS

"List of IBM Patents or Patent Applications Treated as Related" 1 page.
Notice of Allowance dated Jul. 5, 2017 in related U.S. Appl. No. 14/882,800, 5 pages.
Office Action dated Jan. 26, 2017 in related U.S. Appl. No. 14/882,800, 8 pages.
Office Action dated Apr. 14, 2017 for related U.S. Appl. No. 15/171,288, 31 pp.
Office Action dated Nov. 21, 2017 in related U.S. Appl. No. 15/441,353, 6 pages.
Office Action dated Nov. 27, 2017 in related U.S. Appl. No. 15/441,364, 7 pages.
Notice of Allowance dated Oct. 19, 2017 in related U.S. Appl. No. 15/171,288, 7 pages.
Notice of Allowance dated Oct. 20, 2017 in related U.S. Appl. No. 15/474,096, 8 pages.
Specification "Gate-All-Around FIN Device" and drawings in related U.S. Appl. No. 15/724,803, filed Oct. 4, 2017, 23 pages.
Specification "Gate-All-Around FIN Device" and drawings in related U.S. Appl. No. 15/819,486, filed Nov. 21, 2017, 23 pages.
Specification "Gate-All-Around FIN Device" and drawings in related U.S. Appl. No. 15/819,672, filed Nov. 21, 2017, 22 pages.
List of IBM Patents or Patent Applications Treated as Related, 1 page.
U.S. Appl. No. 14/547,780, filed Nov. 19, 2014, U.S. Pat. No. 9,281,379.
U.S. Appl. No. 14/882,800, filed Oct. 14, 2015, U.S. Pat. No. 9,818,542.
U.S. Appl. No. 14/882,809, filed Oct. 14, 2015, U.S. Pat. No. 9,397,163.
U.S. Appl. No. 14/995,307, filed Jan. 14, 2016, U.S. Pat. No. 9,590,108.
U.S. Appl. No. 15/171,288, filed Jan. 2, 2016, US20160284852 A1.
U.S. Appl. No. 15/441,353, filed Feb. 24, 2017, US20170162569 A1.
U.S. Appl. No. 15/441,364, filed Feb. 24, 2017, US20170162673 A1.
U.S. Appl. No. 15/474,078, filed Mar. 30, 2017, US20170207333 A1.
U.S. Appl. No. 15/474,096, filed Mar. 30, 2017, US20170207341 A1.
U.S. Appl. No. 15/474,055, filed Mar. 30, 2017, US20170207340 A1.
U.S. Appl. No. 15/724,803, filed Oct. 4, 2017.
U.S. Appl. No. 15/819,486, filed Nov. 21, 2017.
U.S. Appl. No. 15/819,672, filed Nov. 21, 2017.
U.S. Appl. No. 15/890,797, filed Feb. 7, 2018.
"List of IBM Patents or Patent Applications Treated as Related," 2 pages.
Specification "Gate-All-Around FIN Device" and drawings in related U.S. Appl. No. 15/890,797, filed Feb. 7, 2018, 25 pages.

* cited by examiner

GATE-ALL-AROUND FIN DEVICE

FIELD OF THE INVENTION

The invention relates to semiconductor structures and, more particularly, to gate-all around fin double diffused metal oxide semiconductor (DMOS) devices and methods of manufacture.

BACKGROUND

Integrated circuit (semiconductor) devices, e.g., field effect transistors (FETs), are used in logic, memory, processor, communication devices, e.g., microwave communication, and other integrated circuit devices. The FET includes spaced apart source and drain regions, a channel there between and a gate electrode adjacent the channel. As the integration density of integrated circuit FETs continues to increase, the size of the active region and the channel length decreases.

FinFET technologies have been developed to increase chip density, while allowing a further scaling of the channel length. Although the FinFET technologies can deliver superior levels of scalability, design engineers still face significant challenges in creating designs that optimize the FinFET technologies. For example, as process technologies continue to shrink towards 14-nanometers (nm), it is becoming difficult to achieve a similar scaling of certain device parameters, particularly the power supply voltage, which is the dominant factor in determining dynamic power. For example, design engineers still face significant challenges to design higher voltage FET devices which can handle >2V in fin based technologies for 14 nm and beyond.

SUMMARY

In an aspect of the invention, a method comprises forming a plurality of fin structures from a substrate. The method further comprises forming a well of a first conductivity type and a second conductivity type within the substrate and corresponding fin structures of the plurality of fin structures. The method further comprises forming a source contact on an exposed portion of a first fin structure. The method further comprises forming drain contacts on exposed portions of adjacent fin structures to the first fin structure. The method further comprises forming a gate structure in a dielectric fill material about the first fin structure and extending over the well of the first conductivity type.

In an aspect of the invention, a method comprises: forming a plurality of fin structures from a substrate; implanting a first conductivity type in the substrate to form an N-well and n-implanted fin structures of the plurality of fin structures; implanting a second conductivity type in the substrate to form a P-well and p-implanted fin structures of the plurality of fin structures; forming a source contact on an exposed portion of one p-implanted fin structure; forming drain contacts on exposed portions of adjacent fin structures to the p-implanted fin structure; and forming a gate about the p-implanted fin structure comprising the source contact and extending over the N-well.

In an aspect of the invention, a diffused metal oxide semiconductor (DMOS) device comprises: a substrate of a first conductivity type; a doped well located in the substrate of the first conductivity type; a doped well ring of a second conductivity type and enclosing a central well of the first conductivity type; a first doped fin contact region of the first conductivity type forming a source contact to a gate structure over the central well of the first conductivity type; a second doped fin contact region of the second conductivity type forming drain regions to the gate structure, the second doped fin contact region being formed in the over the doped well ring; and the gate structure over an insulating layer above the central well configured vertically around a fin region of the first doped fin contact region and laterally extending in the direction of and crossing over onto the doped well ring.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to gate-all around fin double diffused metal oxide semiconductor (DMOS) devices and methods of manufacture. Advantageously, the different structures of the present invention each enable >2V MOSFET capability in 14 nm bulk substrates and beyond.

In embodiments, the diffused metal oxide semiconductor (DMOS) device are fully depleted, vertical gate all around controlled, high voltage fin-based metal oxide semiconductor (MOS) devices. In embodiments, the devices comprise several different configurations as described herein. For example, in one configuration, the MOS device comprises: a substrate of the first electrical conductivity type; a lightly doped well located in the substrate of the first electrical conductivity type; a second lightly doped well ring of the second electrical conductivity type located in the first well and enclosing a third central well of the first well type; a first highly doped fin contact region of the first electrical conductivity type in the first electrical conductivity type; a second highly doped fin contact region of the second electrical type in the second lightly doped well ring; a third highly doped fin contact region of alternating first and second electrical conductivity type in the third central well; and a field plate (gate structure) over an insulating layer above the central well configured vertically around the fin region and laterally extending in the direction of, and crossing over, onto the second well.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Figure 1:
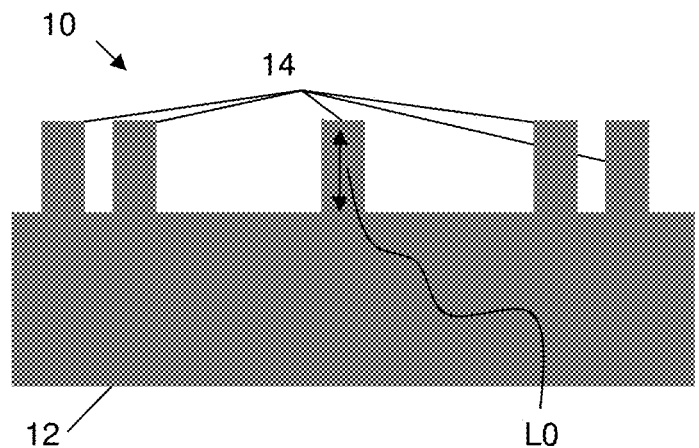
FIGS. 1-5B show structures and respective processing steps in accordance with an aspect of the present invention.

FIG. 1 shows a starting structure in accordance with aspects of the present invention. In particular, the structure 10 comprises a bulk substrate 12 with a plurality of fins 14. In embodiments, the substrate 12 may be composed of any suitable material including, but not limited to, Si, SiGe, SiGeC, SiC, GE alloys, GaAs, InAs, InP, and other III/V or II/VI compound semiconductors. The fins 14 can be manufactured using known lithography and etching processes. For example, the fins 14 can be manufactured using sidewall image transfer (SIT) techniques.

In the SIT technique, for example, a mandrel is formed on the substrate 12, using conventional deposition, lithography and etching processes. In one example, the mandrel material, e.g., $SiO_2$, is deposited on the substrate 12 using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the narrow fin structures and/or wide fin structures. (A SIT squared technique can be used to form different spacings between adjacent narrow fin structures.) Spacers are formed on the sidewalls of the mandrels which are preferably material that is different than the mandrels, and which are formed using conventional deposition processes known to those of skill in the art. The spacers can have a width which matches the dimensions of the fin structures 14, for example. The mandrels are removed or stripped using a conventional etching process, selective to the mandrel material. An etching is then performed within the spacing of the spacers to form the sub-lithographic features. The sidewall spacers can then be stripped. In embodiments, the wide fin structures can also be formed during this or other patterning processes, or through other conventional patterning processes, as contemplated by the present invention. The fins 14 can have any height L0, depending upon the constraints of the fabrication process.

Figure 2:
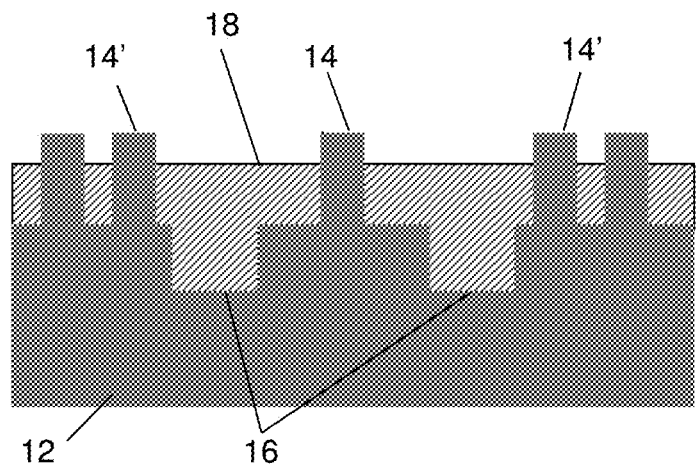

In FIG. 2, shallow trench isolation (STI) structures 16 are formed in the substrate 12, between the fins 14 and 14'. The STI structures 16 can be formed using conventional lithography, etching and deposition processes. For example, a resist can be formed on the substrate 12 and over the fins 14 and 14', and patterned by exposure to energy (light). The patterning will result in openings which provide a window for etching processes, e.g., removal of exposed substrate 12. In embodiments, the etching can be a reactive ion etching (RIE) used with the appropriate etchant chemistries to form trenches in the substrate 12. After the etching process, any remaining resist material can be removed by an oxygen ashing process or other stripping processes known to those of skill in the art. An insulator material can be deposited on the substrate 12, resulting in the STI structures 16 and a dielectric fill 18 between all of the fins.

Figure 3:
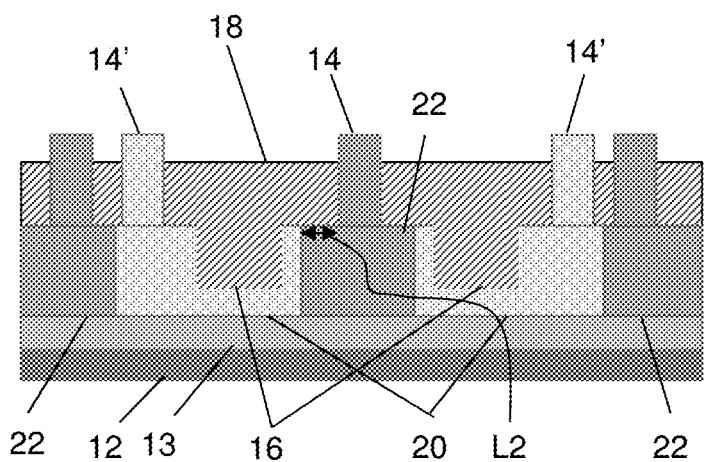

In FIG. 3, the structure undergoes N-well and P-well implantation processes using separate masking and implantation processes. The N-wells 20 can be a lightly doped ring structure, which encloses a conductivity of a different type, e.g., P-well. The N-wells 20 will be drift regions, bringing the current from a source region to a drain region. Also, the N-wells 20 can be modulated for larger or smaller voltage drops (depending on design criteria) by adjusting the distance between the fins 14 and 14'. The N-wells 20 will also be spaced away from the center fin 14 by a distance L2, which will account for the parasitic gate length. In embodiments, it is preferably to minimize the parasitic gate length, L2.

Prior to forming the N-wells 20 and the P-wells 22, a deep blanket boron implant is formed, which is used to assure full depletion of the drift regions in the N-well when the device is in the off state. This deep p-band implant is shown at reference numeral 13. The p-band implant can be a boron implant at approximately 4e12 to 9e12 cm-3 at 65 to 130 keV.

To form the N-wells 20, a mask is placed over the substrate 12 and patterned to form openings corresponding to the N-wells. Thereafter, an N-well implantation is performed to form the N-wells 20. In embodiments, the N-well implantation can be a phosphorous implantation process, known to those of skill in the art. For example, the phosphorous implantation process can comprise two implant processes, e.g., one deep and one shallow to optimize competing device characteristics. For example, the phosphorous implantation process can include a first implantation at approximately 3e12 to 4e13 cm-3 at 15 to 350 keV and a second implantation at approximately 1e12 to 8e12 cm-3 at 10 to 200 keV, in order to form a deep N-well implant region 20. This process will result in the fins 14' having an N– implantation. After implantation processes are complete, the mask can be removed using known stripants or removal processes.

On the other hand, the P-wells 22 are formed with a separate mask placed over the substrate and patterned to form openings corresponding to the P-wells. After the patterning, e.g., forming of openings, a P-well implantation is performed to form the P-wells 22. In embodiments, the P-well implantation can be a boron implantation process, known to those of skill in the art. For example, a boron implantation process can comprise two implant processes, e.g., one deep and one shallow to optimize competing device characteristics. For example, the boron implantation process can include a first implantation of approximately 9e12 to 4e13 cm-3 at 20 to 80 keV and a second implantation process of approximately 0 to 1e13 cm-3 at 10 to 40 keV, in order to form P-well implant regions 22. This process will result in the fins 14 having a P– implantation. After implantation processes are complete, the mask can be removed using known stripants or removal processes.

Figure 4:
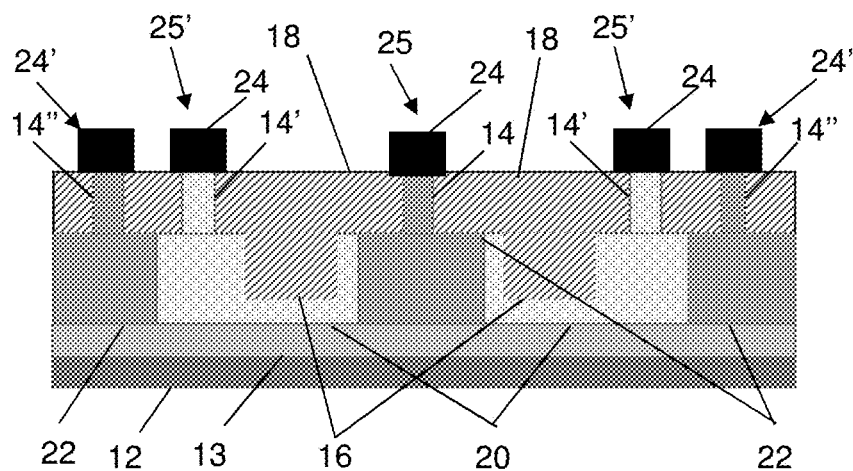

Referring now to FIG. 4, epitaxial growth and implantation processes are performed about exposed portions of the fins 14, 14', e.g., above the dielectric fill 18. In embodiments, the epitaxial growth process will result in a semiconductor material being grown about the exposed tips of the fins 14, 14' (e.g., consuming the exposed tips of the fins 14, 14'), followed by an implantation process (highly doped) to form n+ regions 24 and p+ regions 24' (using separate masking steps). As should be understood by those of skill in the art, the implantation processes is used to the form source region 25 (corresponding to the center fin 14) and drain regions 25' (corresponding to the adjacent fins 14'), as well as p+ body contacts 24' using the outer fins 14". Specifically, in embodiments, the fins 14' and more specifically the highly doped n+ region 24 of the fins 14' will be drain regions 25'; whereas, the highly doped n+ region 24 of the center fin 14 will be a source region 25. Moreover, the highly doped p+ region 24' of the fins 14" are body contacts.

Figure 5A:
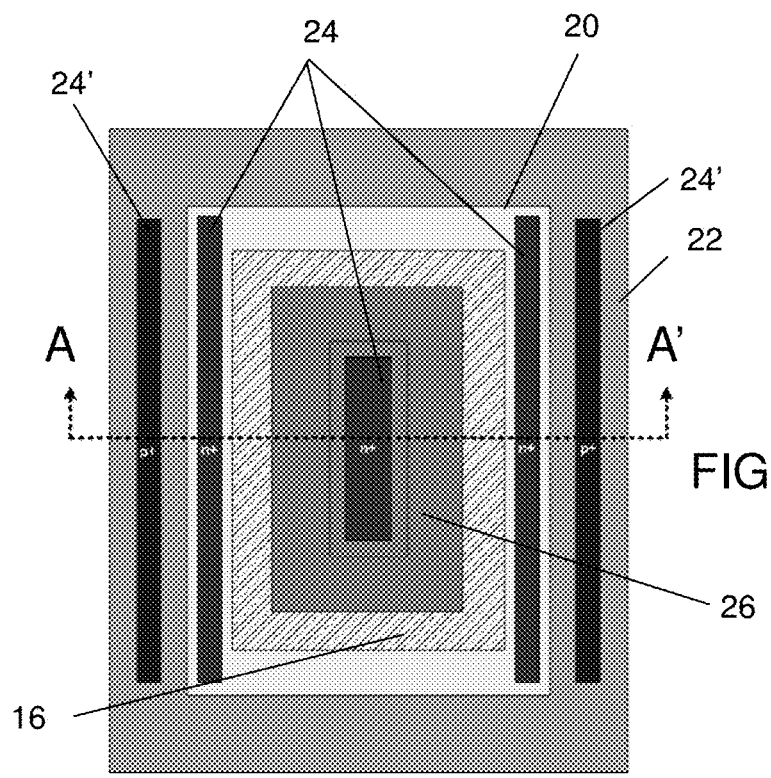
Figure 5B:
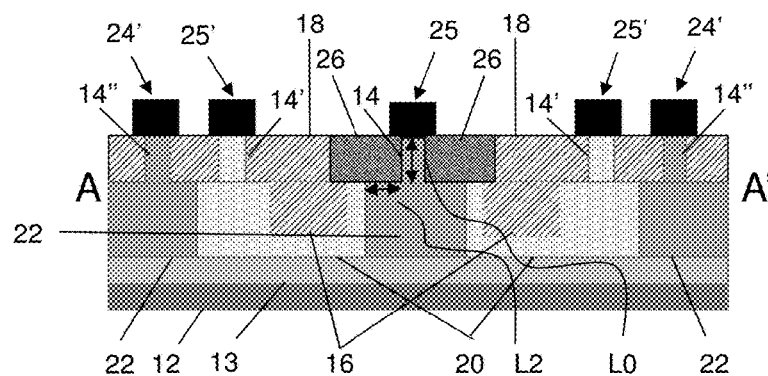

Referring to FIGS. 5A and 5B, in additional processing steps a wrap around gate structure 26 is formed about the center fin 14. In embodiments, the gate structure 26 can be a replacement gate structure process, with a gate dielectric material and metal material. In embodiments, the gate structure 26 extends over the N-wells 20. The gate structure 26 can be formed by removing portions of the dielectric fill material 18 about the center fin 14, followed by deposition of a high quality low-K gate dielectric and metallic material. The gate structure can be configured vertically around the fin region and laterally extending in the direction of and crossing over onto the well regions, as described in the different embodiments herein.

More specifically, the dielectric fill material 18 can be removed using conventional lithography and etching processes. After removal of any resist used in the lithography process, the gate dielectric material can then be deposited on the substrate 12 and about sidewalls of the center fin 14. The gate dielectric material can be a high-k dielectric material, e.g., hafnium based material. A metal or combination of metals such as tungsten fill is then formed (deposited) on the gate dielectric material. The metal material can be combinations of metals with certain designed work functions, depending on the design criteria of the gate structure 26. In embodiments, the dielectric material and the metal material(s) can be deposited using any conventional deposition method such as chemical vapor deposition (CVD), plasma enhanced CVD (PECVD), etc.

Figure 6:
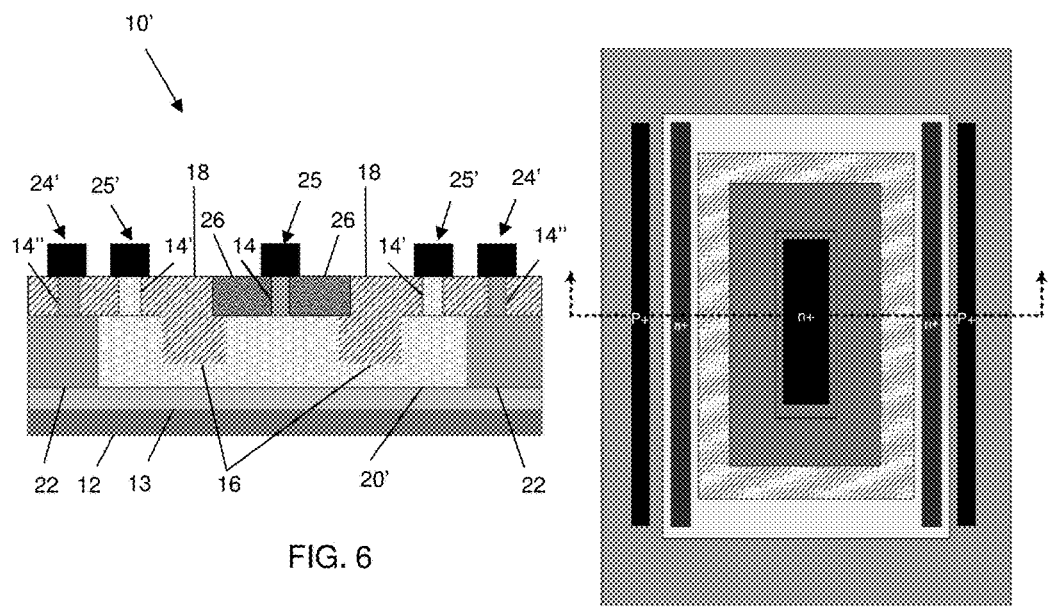
FIGS. 6-12 show additional structures and respective fabrication processes in accordance with additional aspects of the present invention.

FIG. 6 shows another structure and respective fabrication processes in accordance with additional aspects of the present invention. In this aspect of the present invention, the structure 10' includes a continuous deep N-well region 20' formed entirely under the center fin 14 and the fins 14', e.g., source and drain regions 25, 25'. This configuration will form a floating p– fin 14. The N-well region 20' can be formed using the processes described herein, with a mask of a different opening corresponding to the N-well region 20'.

Figure 7:
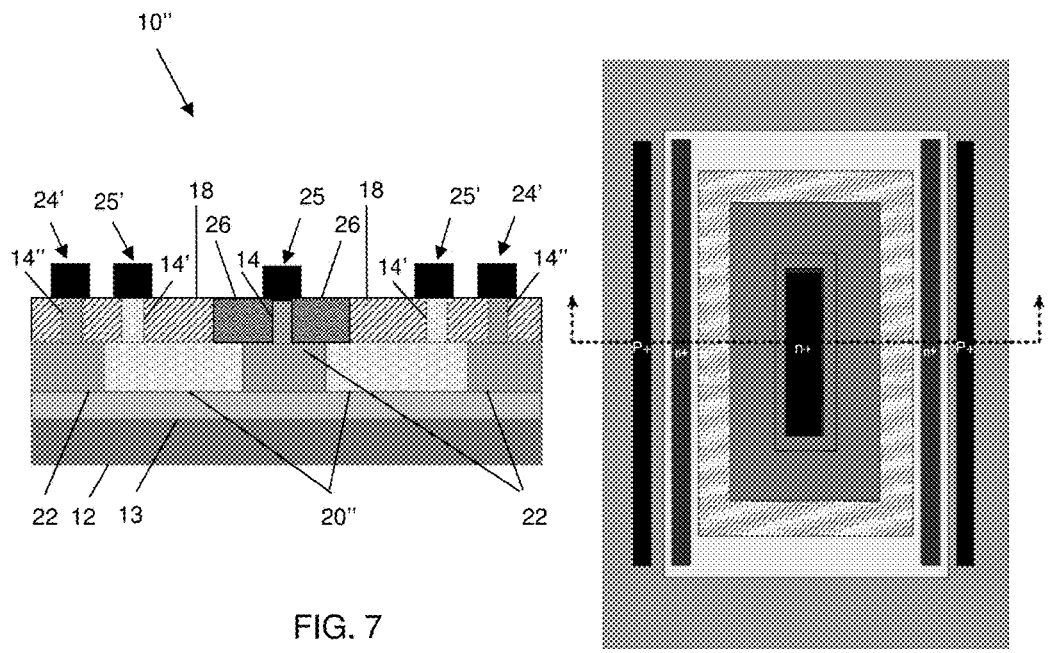

FIG. 7 shows another structure and respective fabrication processes in accordance with additional aspects of the present invention. In this aspect of the present invention, the structure 10" includes shallow N-well regions 20" formed under the fins 14', e.g., drain regions 25', and extending partially underneath the gate structure 26. The N-well regions 20" can be formed using the processes described herein, with a mask of a different opening corresponding to the N-well regions 20" and an implantation process that will result in a shallow N-well 20". For example, in this process, the implantation process using phosphorous can be at an energy level of approximately, 1e12 to 1e13 cm-3, 45 to 150 keV.

Figure 8:
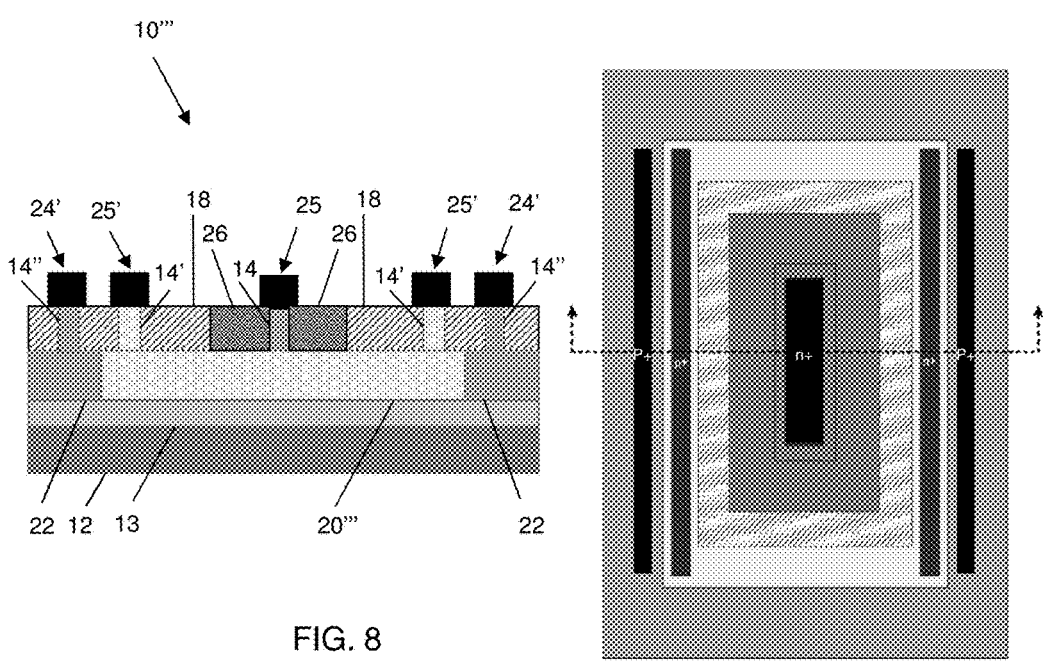
Figure 9:
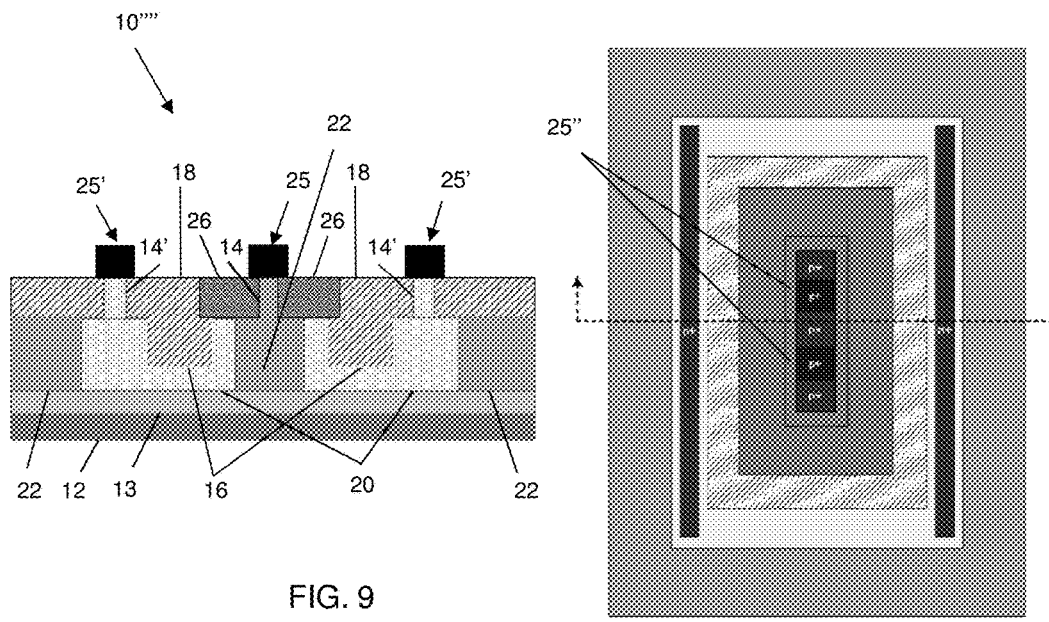

FIG. 8 shows another structure and respective fabrication processes in accordance with additional aspects of the present invention. In this aspect of the present invention, the structure 10'" includes a continuous shallow N-well region 20'" formed under the fins 14, 14', e.g., source and drain regions 25, 25', and fully underneath the gate structure 26. This configuration will form a floating p– fin 14. The N-well region 20'" can be formed using the processes described herein, with a mask of a different opening corresponding to the N-well region 20'" and an implantation process that will result in a shallow N-well region 20'" as described with reference to FIG. 7.

FIGS. 9-12 show additional structures and respective fabrication processes in accordance with additional aspects of the present invention. In these representations, the structures (including the structure 10"" of FIG. 9) include the p+ body contacts 25" directly on the fin 14. In these embodiments, the alternating n+ and p+ regions can be formed with different masks and implantation processes as discussed herein. In addition, the outer fins (e.g., 14" shown in FIG. 4) are no longer required. In these structures, the SIT technique is used to form the center fin 14 and the fins 14', for subsequent formation of the source and drain regions, as represented by reference numerals 25 and 25', respectively. The source and drain regions 25, 25' are formed using the processes as already described herein.

Figure 10:
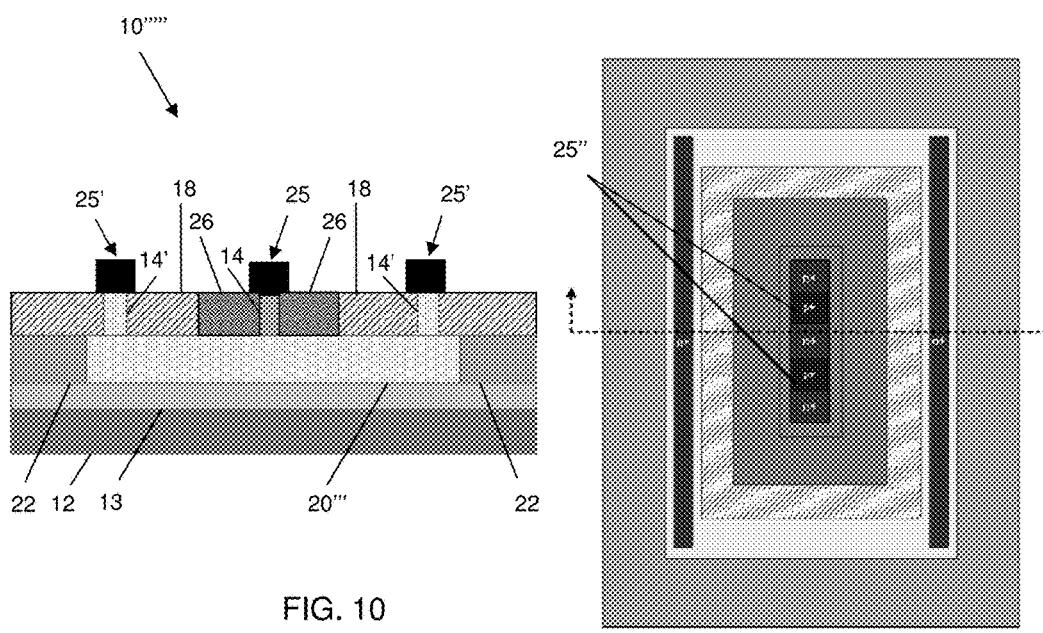

FIG. 10 shows another structure and respective fabrication processes in accordance with additional aspects of the present invention. In this aspect of the present invention, the structure 10""' includes a continuous shallow N-well region 20'" formed under the fins 14, 14', e.g., source and drain regions 25, 25', and fully underneath the gate structure 26. This configuration will form a floating p– fin 14. The N-well region 20'" can be formed using the processes described herein, with a mask of a different opening corresponding to the N-well region 20'" and an implantation process that will result in a shallow N-well 20'" as described with reference to FIGS. 7 and 8. The structure 10""' of FIG. 10 is also devoid of the STI structures 16.

Figure 11:
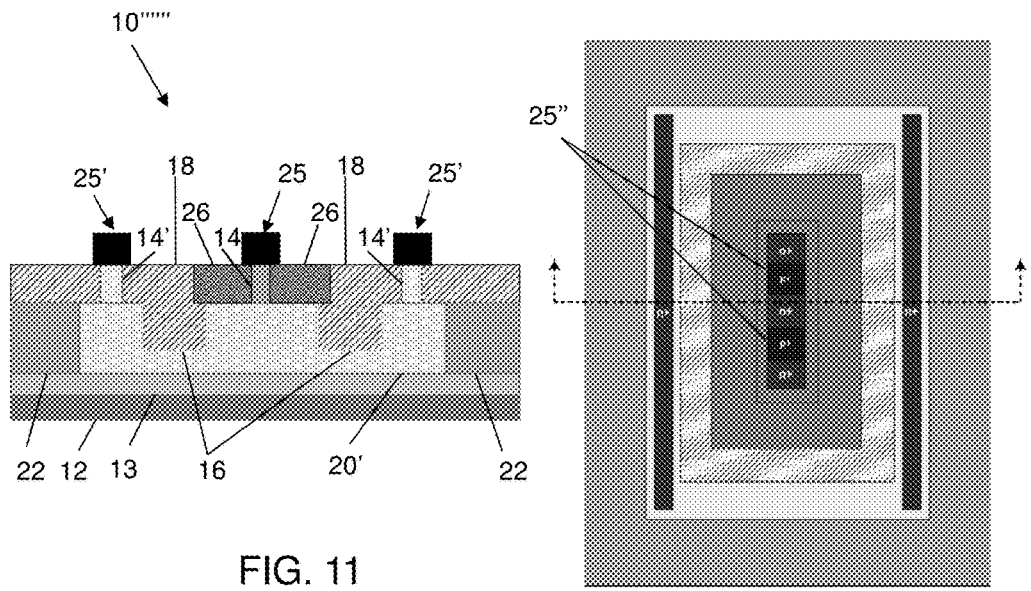

FIG. 11 shows another structure and respective fabrication processes in accordance with additional aspects of the present invention. In this aspect of the present invention, the structure 10"""' includes a continuous deep N-well region 20' formed entirely under the center fin 14 and the fins 14', e.g., source and drain regions 25, 25'. This configuration will form a floating p– fin 14. The N-well region 20' can be formed using the processes described herein, with a mask of a different opening corresponding to the N-well region 20'.

Figure 12:
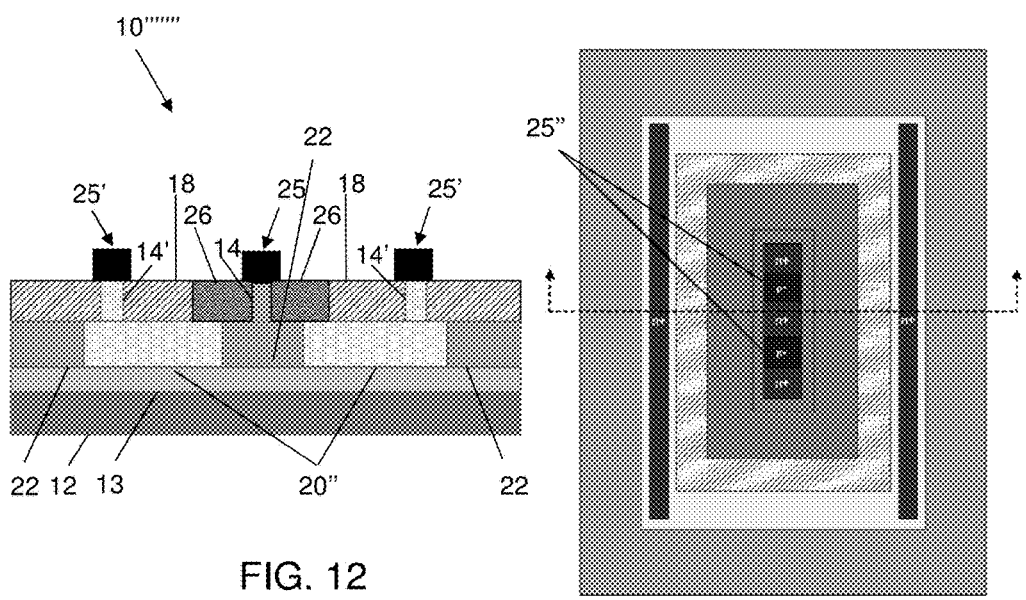

FIG. 12 shows another structure and respective fabrication processes in accordance with additional aspects of the present invention. In this aspect of the present invention, the structure 10"""" includes shallow N-well regions 20" formed under the fins 14', e.g., drain regions 25', and partially extending underneath the gate structure 26. The N-well regions 20" can be formed using the processes described herein, with a mask of a different opening corresponding to the N-well regions 20' and an implantation process that will result in shallow N-wells 20". The structure 10"""" of FIG. 12 is also devoid of the STI structures 16.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
forming a plurality of fin structures from a substrate;
forming a well of a first conductivity type and a well of a second conductivity type within the substrate and corresponding fin structures of the plurality of fin structures;
forming a source contact on an exposed portion of a first fin structure of the plurality of fin structures;
forming drain contacts on exposed portions of second fin structures of the plurality of fin structures, wherein the second fin structures are adjacent to the first fin structure; and
forming a gate structure in a dielectric fill material about the first fin structure and extending over the well of the first conductivity type, wherein:
the well of the first conductivity type is formed as a shallow N-well and the well of the second conductivity type is formed as a P-well, and
the gate structure is formed partially over the shallow N-well and the P-well.

2. The method of claim 1, wherein the shallow N-well is a ring structure.

3. The method of claim 2, wherein the dielectric fill material extends between the first fin structure and the second fin structures.

4. The method of claim 3, wherein the dielectric fill material overlaps a portion of an upper surface of the shallow N-well and a portion of the P-well.

5. The method of claim 1, further comprising forming the source contact and the drain contacts by an epitaxial growth process followed by an n+ implantation process.

6. The method of claim 1, wherein the forming of the plurality of fin structures includes forming body contact fins.

7. The method of claim 1, wherein the second fin structures and the drain contacts are formed over the shallow N-well.

8. The method of claim 7, further comprising forming third fin structures of the plurality of fin structures, wherein the second fin structures are interposed between the first fin structure and the third fin structures.

9. The method of claim 8, wherein the third fin structures are formed above the P-well.

10. The method of claim 9, further comprising forming P-well contacts over the third fin structures.

11. The method of claim 10, wherein the dielectric fill material extends between the second fin structures and the third fin structures.

12. A semiconductor device comprising:
a plurality of fin structures formed on a substrate;
a well of a first conductivity type and a well of a second conductivity type formed within the substrate and corresponding fin structures of the plurality of fin structures;
a source contact formed on an exposed portion of a first fin structure of the plurality of fin structures;
drain contacts formed on exposed portions of second fin structures of the plurality of fin structures, wherein the second fin structures are adjacent to the first fin structure; and
a gate structure formed in a dielectric fill material about the first fin structure and extending over the well of the first conductivity type, wherein:
the well of the first conductivity type is formed as a shallow N-well and the well of the second conductivity type is formed as a P-well, and
the gate structure is formed partially over the shallow N-well and the P-well.

13. The device of claim 12, wherein the shallow N-well is a ring structure.

14. The device of claim 13, wherein the dielectric fill material extends between the first fin structure and the second fin structures.

15. The device of claim 14, wherein the dielectric fill material overlaps a portion of an upper surface of the shallow N-well and a portion of the P-well.

16. The device of claim 12, wherein the second fin structures and the drain contacts are formed over the shallow N-well.

17. The device of claim 16, further comprising third fin structures of the plurality of fin structures, wherein the second fin structures are interposed between the first fin structure and the third fin structures.

18. The device of claim 17, wherein the third fin structures are formed above the P-well.

19. The device of claim 18, further comprising P-well contacts formed over the third fin structures.

20. The device of claim 19, wherein the dielectric fill material extends between the second fin structures and the third fin structures.

* * * * *